(12) United States Patent
Ohoka et al.

(10) Patent No.: US 10,748,838 B2
(45) Date of Patent: Aug. 18, 2020

(54) SILICON CARBIDE SEMICONDUCTOR DEVICE

(71) Applicant: Panasonic Intellectual Property Management Co., Ltd., Osaka (JP)

(72) Inventors: Atsushi Ohoka, Kyoto (JP); Nobuyuki Horikawa, Kyoto (JP); Masao Uchida, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/255,874

(22) Filed: Jan. 24, 2019

(65) Prior Publication Data

US 2019/0244879 A1   Aug. 8, 2019

(30) Foreign Application Priority Data

Feb. 7, 2018   (JP) .................... 2018-020108

(51) Int. Cl.
*H01L 23/482* (2006.01)
*H01L 29/78* (2006.01)
(Continued)

(52) U.S. Cl.
CPC ...... *H01L 23/4824* (2013.01); *H01L 29/0696* (2013.01); *H01L 29/1608* (2013.01); *H01L 29/4238* (2013.01); *H01L 29/7811* (2013.01); *H01L 29/7828* (2013.01); *H01L 29/0619* (2013.01); *H01L 29/41766* (2013.01)

(58) Field of Classification Search
CPC ............. H01L 23/4824; H01L 29/0696; H01L 29/1608; H01L 29/4238; H01L 29/7811; H01L 29/7828; H01L 29/0619; H01L 29/41766; H01L 29/083; H01L 29/0865;
(Continued)

(56) References Cited

U.S. PATENT DOCUMENTS 5,686,750 A    11/1997  Takahashi
2012/0217577 A1*  8/2012  Hashimoto ....... H01L 29/66727
                                                                257/330
(Continued)

FOREIGN PATENT DOCUMENTS

JP          3-252166        11/1991
JP          5-198816         8/1993

*Primary Examiner* — Shahed Ahmed
(74) *Attorney, Agent, or Firm* — McDermott Will & Emery LLP

(57) ABSTRACT

A silicon carbide semiconductor device includes an upper gate electrode including a gate pad and a gate wiring line, and an upper source electrode including first and second source pads. The gate wiring line includes a gate global wiring line extending to encircle the source pads, and a gate connection wiring line. The upper source electrode includes an outer periphery source wiring line extending to encircle the gate global wiring line, and first and second source connections connecting the outer periphery source wiring line to the first and second source pads, respectively. The gate global wiring line includes a first portion, a second portion, and a third portion. The first portion is split at a first substrate corner and a second substrate corner and lies between the first substrate corner and the second substrate corner.

16 Claims, 7 Drawing Sheets

(51) Int. Cl.
  *H01L 29/06* (2006.01)
  *H01L 29/16* (2006.01)
  *H01L 29/423* (2006.01)
  *H01L 29/417* (2006.01)

(58) Field of Classification Search
  CPC ............. H01L 29/1095; H01L 29/36; H01L 21/0445–0495; H01L 21/18–326
  See application file for complete search history.

(56) References Cited

U.S. PATENT DOCUMENTS

| | | | | |
|---|---|---|---|---|
| 2012/0326207 | A1* | 12/2012 | Yoshimochi | H01L 29/866 257/139 |
| 2013/0020586 | A1* | 1/2013 | Miura | H01L 29/0615 257/77 |
| 2013/0168700 | A1* | 7/2013 | Furukawa | H01L 29/7805 257/77 |
| 2015/0349051 | A1* | 12/2015 | Uchida | H01L 29/7811 257/77 |
| 2017/0098647 | A1* | 4/2017 | Uchida | H01L 27/0629 |
| 2018/0096991 | A1* | 4/2018 | Nasu | H01L 27/088 |

* cited by examiner

SILICON CARBIDE SEMICONDUCTOR DEVICE

BACKGROUND

1. Technical Field

The present disclosure relates to a silicon carbide semiconductor device.

2. Description of the Related Art

A power semiconductor device is a semiconductor element for use in applications that require high breakdown voltage while withstanding a large current flow. It is desired that such a power semiconductor device operates with low power loss. A power semiconductor device including silicon (Si) substrate has been widely used. In recent years, however, a power semiconductor device including silicon carbide (SiC) substrate has been attracting people's attention and development of such a power semiconductor device is in progress.

On material level, silicon carbide (SiC) has a critical electric field higher than that of silicon (Si) by one order of magnitude, thus offering a feature that silicon carbide can maintain a breakdown voltage even when a depletion layer at a pn junction or a Schottky junction is reduced in thickness. Using silicon carbide therefore allows a reduction in the thickness of a drift layer and an increase in its doping concentration. Expectation is thus high that silicon carbide will be used as a material making up a power semiconductor device that shows low on-resistance, offers high breakdown voltage, and suffers less power loss.

Motor-driven vehicles, such as hybrid cars, electric cars, and fuel cell cars, have been developed recently. The above characteristics of silicon carbide are advantageous to switching elements in inverter circuits that drive the motors of these vehicles. For this reason, a silicon carbide power semiconductor device is now developed for use in vehicles.

One typical example of semiconductor elements using SiC is a metal-insulator-semiconductor field-effect transistor (MISFET). A metal-oxide-semiconductor field-effect transistor (MOSFET) is a variation of the MISFET.

A MISFET using SiC usually has a cell region in which a plurality of unit cells each having a transistor structure are arranged two-dimensionally. These unit cells are connected in parallel to each other. Such a structure of a MISFET is disclosed in, for example, PTLs 1 and 2.

CITATION LIST

Patent Literature

PTL1: Unexamined Japanese Patent Publication No. 3-252166
PTL1: Unexamined Japanese Patent Publication No. 5-198816

SUMMARY

The above silicon carbide semiconductor device according to the conventional technique has been required to meet a demand that an in-plane variation of gate resistance should be reduced in the cell region in which the plurality of unit cells are arranged. When a region in which gate resistance is locally high arises, switching speed of unit cells in the region drops. This could lead to a problem that current concentration tends to occur during a high-speed switching operation.

An aspect of the present disclosure provides a silicon carbide semiconductor device capable of further reducing an in-plane variation of gate resistance.

An aspect of the present disclosure provides a silicon carbide semiconductor device including a silicon carbide semiconductor substrate. In the silicon carbide semiconductor device, the silicon carbide semiconductor substrate includes an active region and a termination region encircling the active region. The silicon carbide semiconductor device includes a plurality of unit cells lying in the active region, each of the unit cells having a transistor structure, and a termination structure lying in the termination region. The silicon carbide semiconductor device further includes an upper gate electrode and an upper source electrode. The upper gate electrode is electrically connected to gate electrodes of the plurality of unit cells. The upper gate electrode includes a gate pad and a gate wiring line extending from the gate pad. The upper source electrode is electrically connected to source electrodes of the plurality of unit cells. The upper source electrode includes a plurality of source pads including a first source pad and a second source pad that are arranged in the active region. The gate wiring line includes a gate global wiring line and a gate connection wiring line. The gate global wiring line extends in the termination region in such a way as to encircle the plurality of source pads. The gate connection wiring line extends from the gate pad to stretch between the first source pad and the second source pad in the active region. The upper source electrode further includes an outer periphery source wiring line, a first source connection, and a second source connection. The outer periphery source wiring line extends in the termination region in such a way as to encircle the gate global wiring line. The first source connection connects the outer periphery source wiring line to the first source pad. The second source connection connects the outer periphery source wiring line to the second source pad. In a plan view, the silicon carbide semiconductor substrate has a plurality of substrate corners including a first substrate corner and a second substrate corner. The gate global wiring line is split at the first substrate corner and at the second substrate corner. The gate global wiring line includes a first portion, a second portion, and a third portion. The first portion lies between the first substrate corner and the second substrate corner, and is in contact with the gate connection wiring line. The second portion is split from the first portion at the first substrate corner. The third portion is split from the first portion at the second substrate corner. The first source connection is disposed between the first portion and the second portion at the first substrate corner. The second source connection is disposed between the first portion and the third portion at the second substrate corner.

Another aspect of the present disclosure provides a silicon carbide semiconductor device including a silicon carbide semiconductor substrate. In the silicon carbide semiconductor device, the silicon carbide semiconductor substrate includes an active region and a termination region encircling the active region. The silicon carbide semiconductor device includes a plurality of unit cells lying in the active region, each of the unit cells having a transistor structure, and a termination structure lying in the termination region. The silicon carbide semiconductor device further includes an upper gate electrode and an upper source electrode. The upper gate electrode is electrically connected to gate electrodes of the plurality of unit cells. The upper gate electrode includes a gate pad and a gate wiring line extending from the gate pad. The upper source electrode is electrically connected to source electrodes of the plurality of unit cells. The upper source electrode includes at least one source pad disposed in the active region. The gate wiring line includes a gate global wiring line. The gate global wiring line extends in the termination region in such a way as to encircle the at least one source pad. The upper source electrode further includes an outer periphery source wiring line and a source connection. The outer periphery source wiring line extends in the termination region in such a way as to encircle the gate global wiring line. The source connection connects the outer periphery source wiring line to the at least one source pad. In a plan view, the silicon carbide semiconductor substrate has a plurality of substrate corners. The gate global wiring line is split into a first portion and a second portion at least at a first substrate corner located farthest from the gate pad among the plurality of substrate corners. The source connection is disposed between the first portion and the second portion at the first substrate corner.

According to an aspect of the present disclosure, an in-plane variation of gate resistance in the silicon carbide semiconductor device can be further reduced.

DETAILED DESCRIPTION

Figure 1A:
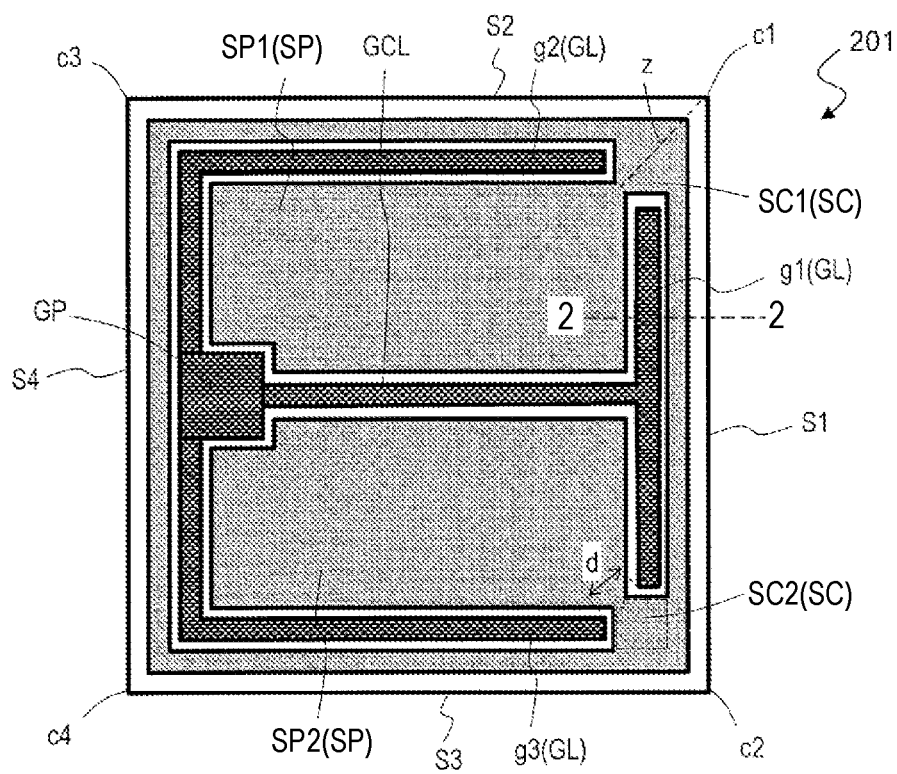
FIG. 1A is a plan view of silicon carbide semiconductor device 201 according to an exemplary embodiment.

A silicon carbide semiconductor device of the present disclosure is outlined as follows.

A silicon carbide semiconductor device according to an aspect of the present disclosure is a silicon carbide semiconductor device including a silicon carbide semiconductor substrate. In the silicon carbide semiconductor device, the silicon carbide semiconductor substrate includes an active region and a termination region encircling the active region. The silicon carbide semiconductor device includes a plurality of unit cells lying in the active region, each of the unit cells having a transistor structure, and a termination structure lying in the termination region. The silicon carbide semiconductor device further includes an upper gate electrode and an upper source electrode. The upper gate electrode is electrically connected to gate electrodes of the plurality of unit cells. The upper gate electrode includes a gate pad and a gate wiring line extending from the gate pad. The upper source electrode is electrically connected to source electrodes of the plurality of unit cells. The upper source electrode includes a plurality of source pads including a first source pad and a second source pad that are arranged in the active region. The gate wiring line includes a gate global wiring line and a gate connection wiring line. The gate global wiring line extends in the termination region in such a way as to encircle the plurality of source pads. The gate connection wiring line extends from the gate pad to stretch between the first source pad and the second source pad in the active region. The upper source electrode further includes an outer periphery source wiring line, a first source connection, and a second source connection. The outer periphery source wiring line extends in the termination region in such a way as to encircle the gate global wiring line. The first source connection connects the outer periphery source wiring line to the first source pad. The second source connection connects the outer periphery source wiring line to the second source pad. In a plan view, the silicon carbide semiconductor substrate has a plurality of substrate corners including a first substrate corner and a second substrate corner. The gate global wiring line is split at the first substrate corner and at the second substrate corner. The gate global wiring line includes a first portion, a second portion, and a third portion. The first portion lies between the first substrate corner and the second substrate corner, and is in contact with the gate connection wiring line. The second portion is split from the first portion at the first substrate corner. The third portion is split from the first portion at the second substrate corner. The first source connection is disposed between the first portion and the second portion at the first substrate corner. The second source connection is disposed between the first portion and the third portion at the second substrate corner.

The outer periphery source wiring line may have a first wiring line corner and a second wiring line corner that are located, for example, at the first substrate corner and the second substrate corner, respectively. The first source connection may be in contact with the first wiring line corner of the outer periphery source wiring line. The second source connection may be in contact with the second wiring line corner of the outer periphery source wiring line.

In a plan view, the distance between the first portion and the second portion and the distance between the first portion and the third portion are, for example, equal to or larger than the width of the outer periphery source wiring line and may be equal to or smaller than 4 times the width of the outer periphery source wiring line. A plan view means a view of the silicon carbide semiconductor substrate and the silicon carbide semiconductor device in a direction perpendicular to the main surface of the silicon carbide semiconductor substrate. For example, when the main surface of the silicon carbide semiconductor substrate is defined as c-plane ((0001) plane), a plan view means seeing the silicon carbide semiconductor substrate or the silicon carbide semiconductor device in the <0001> direction.

The silicon carbide semiconductor substrate may be, for example, a rectangle. The gate pad may lie at the center of one side of the silicon carbide semiconductor substrate, the side being opposite to the first and second substrate corners.

The silicon carbide semiconductor substrate may be, for example, a rectangle having the first substrate corner, the second substrate corner, a third substrate corner, and a fourth substrate corner. The gate pad may lie at the center of the silicon carbide semiconductor substrate. The plurality of source pads may further include a third source pad and a fourth source pad. The gate global wiring line may be split at each of the first substrate corner to the fourth substrate corner. The gate global wiring line may further include a third source connection and a fourth source connection. The third source connection lies at the third substrate corner and connects the outer periphery source wiring line to the third source pad. The fourth source connection lies at the fourth substrate corner and connects the outer periphery source wiring line to the fourth source pad.

The silicon carbide semiconductor substrate has, for example, a semiconductor substrate of a first conductivity type, and a silicon carbide semiconductor layer of the first conductivity type, the silicon carbide semiconductor layer being disposed on a main surface of the semiconductor substrate. In the active region, each of the plurality of unit cells has a first body region of a second conductivity type, a source region of the first conductivity type, a gate insulating film, a gate electrode, and a source electrode. The first body region of the second conductivity type is formed selectively on a surface of the silicon carbide semiconductor layer. The source region of the first conductivity type is formed selectively in the first body region. The gate insulating film lies above the silicon carbide semiconductor layer. The gate electrode lies on the gate insulating film. The source electrode is electrically connected to the first body region and to the source region. The termination structure is formed selectively on the surface of the silicon carbide semiconductor layer. The termination structure has a second body region of the second conductivity type and at least one ring region of the second conductivity type. The second body region has an annular shape encircling the active region. The ring region lies on the surface of the silicon carbide semiconductor layer and may encircle the second body region.

The silicon carbide semiconductor device may further include, for example, a gate electrode layer and a gate contact. The gate electrode layer includes the gate electrodes of the plurality of unit cells, and a gate frame encircling the gate electrodes of the unit cells. The gate contact electrically connects the gate global wiring line to the gate frame. The width of the gate frame under the gate global wiring line may be equal to the width of the gate frame under the first source connection and second source connection.

The above silicon carbide semiconductor device may further include, for example, a plurality of first corner body contacts and a plurality of second corner body contacts. The first corner body contacts connect the first source connection to the second body region at the first substrate corner. The second corner body contacts connect the second source connection to the second body region at the second substrate corner.

The above silicon carbide semiconductor device may further include, for example, an outer periphery body contact. The outer periphery body contact connects the outer periphery source wiring line to the second body region. The plurality of first corner body contacts and second corner body contacts may be arranged between the gate electrode layer and the outer periphery body contact. The plurality of first corner body contacts and second corner body contacts may be arranged outside the gate frame along an outer periphery of the gate frame.

Another aspect of the present disclosure provides a silicon carbide semiconductor device including a silicon carbide semiconductor substrate. In the silicon carbide semiconductor device, the silicon carbide semiconductor substrate includes an active region and a termination region encircling the active region. The silicon carbide semiconductor device includes a plurality of unit cells lying in the active region, each of the unit cells having a transistor structure, and a termination structure lying in the termination region. The silicon carbide semiconductor device further includes an upper gate electrode and an upper source electrode. The upper gate electrode is electrically connected to gate electrodes of the plurality of unit cells. The upper gate electrode includes a gate pad and a gate wiring line extending from the gate pad. The upper source electrode is electrically connected to source electrodes of the plurality of unit cells. The upper source electrode includes at least one source pad disposed in the active region. The gate wiring line includes a gate global wiring line. The gate global wiring line extends in the termination region in such a way as to encircle at least one source pad. The upper source electrode further includes an outer periphery source wiring line and a source connection. The outer periphery source wiring line extends in the termination region in such a way as to encircle the gate global wiring line. The source connection connects the outer periphery source wiring line to at least one source pad. In a plan view, the silicon carbide semiconductor substrate has a plurality of substrate corners. The gate global wiring line is split into a first portion and a second portion at least at a first substrate corner located farthest from the gate pad among the plurality of substrate corners. The source connection is disposed between the first portion and the second portion at the first substrate corner.

The silicon carbide semiconductor substrate has, for example, a semiconductor substrate of a first conductivity type, and a silicon carbide semiconductor layer of the first conductivity type, the silicon carbide semiconductor layer being disposed on a main surface of the semiconductor substrate. In the active region, each of the plurality of unit cells has a first body region of a second conductivity type, a source region of the first conductivity type, a gate insulating film, a gate electrode, and a source electrode. The first body region is formed selectively on a surface of the silicon carbide semiconductor layer. The source region is formed selectively in the first body region. The gate insulating film lies above the silicon carbide semiconductor layer. The gate electrode lies on the gate insulating film. The source electrode is electrically connected to the first body region and to the source region. The termination structure may have a second body region of the second conductivity type and at least one ring region of the second conductivity type. The second body region is formed selectively on the surface of the silicon carbide semiconductor layer and has an annular shape encircling the active region. The ring region of the second conductivity type lies on the surface of the silicon carbide semiconductor layer and encircles the second body region.

The above silicon carbide semiconductor device may further include, for example, a gate electrode layer and a gate contact. The gate electrode layer includes the gate electrodes of the plurality of unit cells, and a gate frame encircling the gate electrodes of the unit cells. The gate contact electrically connects the gate global wiring line to the gate frame. The width of the gate frame under the gate global wiring line may be equal to the width of the gate frame under the source connection. The above silicon carbide semiconductor device may further include, for example, a plurality of corner body contacts that, at the first substrate corner, connect the source connection to the second body region.

The above silicon carbide semiconductor device may further include, for example, an outer periphery body contact that connects the outer periphery source wiring line to the second body region. The plurality of corner body contacts may be arranged between the gate electrode layer and the outer periphery body contact.

The plurality of corner body contacts may be arranged outside the gate frame along an outer periphery of the gate frame.

Exemplary Embodiment

A silicon carbide semiconductor device according to an exemplary embodiment of the present disclosure will hereinafter be described with reference to the accompanying drawings.

Figure 1B:
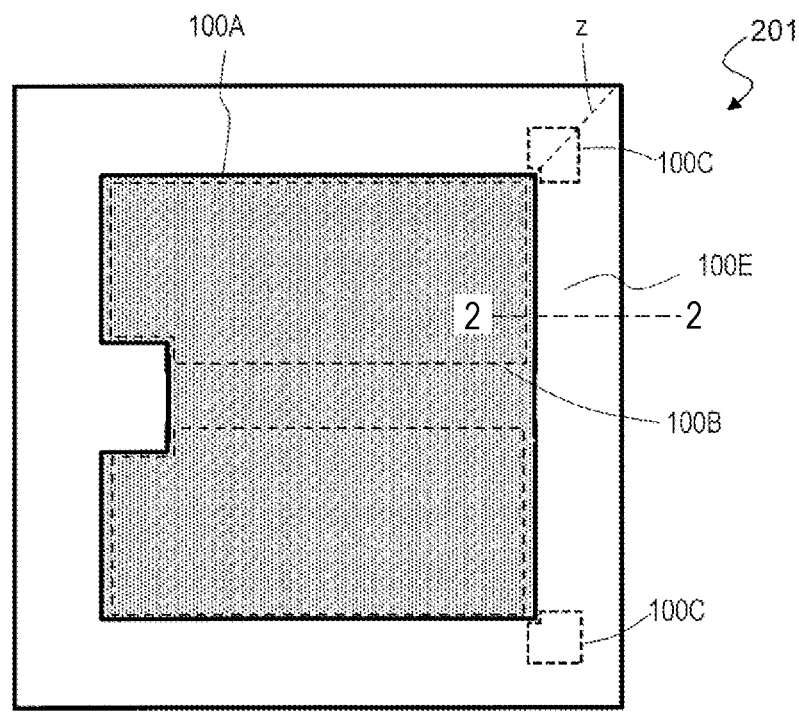
FIG. 1B is a plan view for describing each of regions included in silicon carbide semiconductor device 201.
Figure 2:
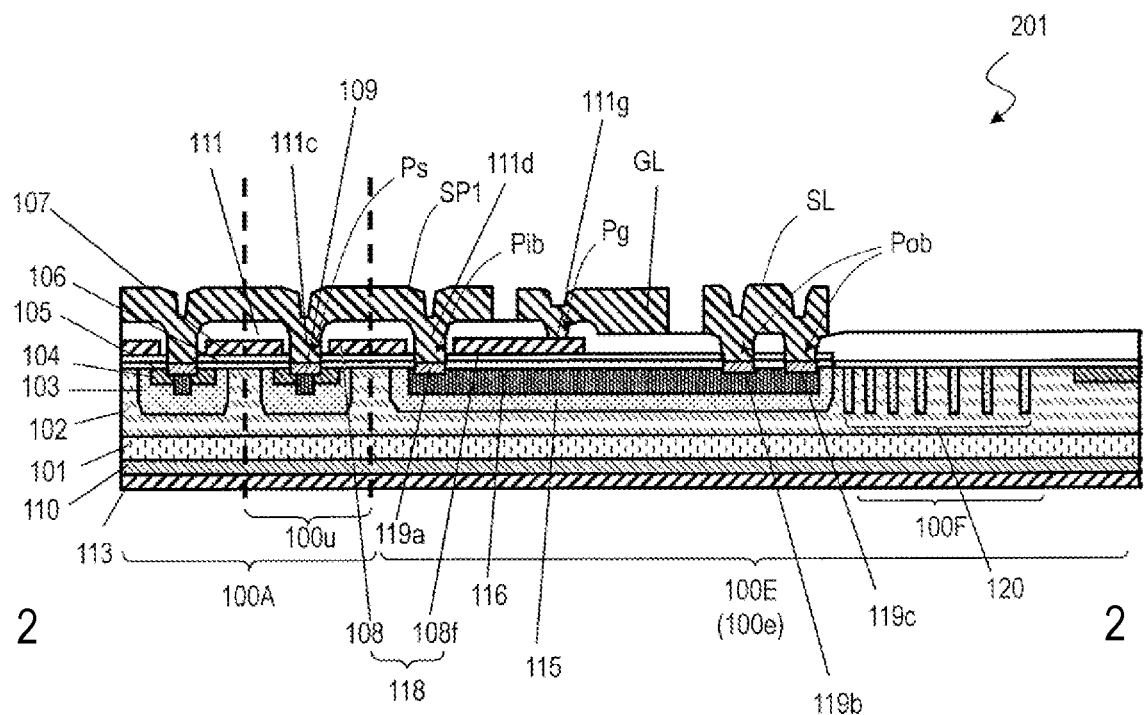
FIG. 2 is a sectional view of silicon carbide semiconductor device 201, the sectional view being taken along line 2-2 in FIG. 1A.

FIG. 1A is a plan view of silicon carbide semiconductor device 201 according to an exemplary embodiment. FIG. 1B is a plan view for describing each of regions included in silicon carbide semiconductor device 201. FIG. 2 is a cross-sectional view of silicon carbide semiconductor device 201, the cross-sectional view being taken along line 2-2 in FIG. 1A.

Silicon carbide semiconductor device 201 includes semiconductor substrate 101 of the first conductivity type, semiconductor substrate 101 having a first main surface and a second main surface, and first silicon carbide semiconductor layer (drift layer) 102 of the first conductivity type, first silicon carbide semiconductor layer 102 lying on the first main surface of semiconductor substrate 101. Semiconductor substrate 101 is, for example, a silicon carbide substrate. The second main surface of semiconductor substrate 101 is overlaid with drain electrode 110, on which back electrode 113 lies. According to the exemplary embodiment, the first conductivity type is an n-type and a second conductivity type is a p-type. However, the first conductivity type may be the p-type and the second conductivity type may be the n-type.

In this specification, a semiconductor structure including semiconductor substrate 101 and first silicon carbide semiconductor layer 102 of the first conductivity type is referred to as "silicon carbide semiconductor substrate". As shown in FIG. 1B, the silicon carbide semiconductor substrate includes active region 100A and termination region 100E. Termination region 100E is a region disposed along a periphery of active region 100A to encircle active region 100A. Active region 100A includes cell regions 100B in which a plurality of unit cells 100u are arranged. Each of unit cells 100u has a transistor structure including source electrode 109, drain electrode 110, and gate electrode 108. This transistor structure will be described in detail later.

In this example, the silicon carbide semiconductor substrate, in a plan view, is a rectangle having four corners. In the following description, an upper right corner and its nearby area, a lower right corner and its nearby area, an upper left corner and its nearby area, and a lower left corner and its nearby area of the silicon carbide semiconductor substrate shown in FIG. 1A are referred to as "first substrate corner c1", "second substrate corner c2", "third substrate corner c3", and "fourth substrate corner c4", respectively. In a plan view, each substrate corner may have no distinctive apex and may be, for example, rounded into a circular arc. A side between first substrate corner c1 and second substrate corner c2 is referred to as "first side S1", a side between first substrate corner c1 and third substrate corner c3 as "second side S2", a side between second substrate corner c2 and fourth substrate corner c4 as "third side S3", and a side between third substrate corner c3 and fourth substrate corner c4 as "fourth side S4".

On a main surface of the silicon carbide semiconductor substrate, an upper gate electrode including gate pad GP and an upper source electrode including a plurality of source pads SP are provided, as shown in FIG. 1A. The upper gate electrode is electrically connected to gate electrodes 108 of a plurality of unit cells 100u. The upper source electrode is electrically connected to source electrodes 109 of the plurality of unit cells 100u. The upper gate electrode and the upper source electrode are electrically separated from each other. The upper gate electrode and the upper source electrode may be made from the same conductive film, such as an Al film.

Gate pad GP and source pads SP are pads for supplying electric signals to silicon carbide semiconductor device 201. To these pads, for example, aluminum wires are bonded. Gate pad GP is disposed, for example, in a region different from cell regions 100B. In this example, gate pad GP is disposed close to the center of one side (fourth side S4) of the silicon carbide semiconductor substrate in termination region 100E. Source pads SP are arranged, for example, in active region 100A. In this example, source pads SP include first and second source pads SP1, SP2 arranged in cell regions 100B. In a plan view, first source pad SP1 and second source pad SP2 are disposed respectively on both sides of gate pad GP and gate connection wiring line GCL, which will be described later.

Upper gate electrode includes a gate wiring line extending from gate pad GP. Gate pad GP and the gate wiring line are physically connected and are therefore electrically connected to each other. The gate wiring line includes gate global wiring line GL and gate connection wiring line GCL. Gate global wiring line GL extends in termination region 100E in such a way as to encircle the plurality of source pads SP. Gate connection wiring line GCL includes a portion extending in active region 100A. Gate connection wiring line GCL, for example, extends from gate pad GP and stretches out between first source pad SP1 and second source pad SP2 to reach termination region 100E, where gate connection wiring line GCL is connected to gate global wiring line GL.

Gate global wiring line GL is split at least at one substrate corner located farthest from gate pad GP among the plurality of substrate corners. "Gate global wiring line GL is split at a substrate corner" means that, for example, gate global wiring line GL is not present at least on segment z connecting a substrate corner to a corner of active region 100A that is close to the substrate corner in a plan view. When n source pads SP are present, gate global wiring line GL may be split at least at n spots. Portions of gate global wiring line GL resulting from the division are each electrically connected to gate pad GP directly or via a different gate wiring line.

In this example, gate global wiring line GL is split at two spots, that is, first substrate corner c1 and second substrate corner c2. Gate pad GP is disposed at the center of fourth side S4 opposite to first side S1 extending between first substrate corner c1 and second substrate corner c2. First substrate corner c and second substrate corner c2 are, therefore, located farther from gate pad GP than substrate corners c3 and c4. The distance from gate pad GP to first substrate corner c1 and the distance from gate pad GP to second substrate corner c2 along the periphery of the silicon carbide semiconductor substrate may be the same.

Gate global wiring line GL is split at the above two spots into three separate portions. Portion g1 lying between first substrate corner c1 and second substrate corner c2 is referred to as "first portion", portion g2 split from first portion g1 at first substrate corner c1 is referred to as "second portion", and portion g3 split from first portion g1 at second substrate corner c2 is referred to as "third portion".

First portion g1 is connected to gate connection wiring line GCL and is electrically connected to gate pad GP via gate connection wiring line GCL. First portion g1 may extend along first side S1. In this example, first portion g1 extending along first side S1 and gate connection wiring line GCL extending from gate pad GP in parallel with second side S2 make up a T shape.

Second portion g2 may start from gate pad GP and extend along fourth side S4 and second side S2 up to a point in front of first substrate corner c1. Third portion g3 may start from gate pad GP and extend along fourth side S4 and third side S3 up to a point in front of second substrate corner c2.

The upper source electrode includes outer periphery source wiring line SL and source connections SC, connecting outer periphery source wiring line SL to source pads SP. Outer periphery source wiring line SL extends in termination region 100E in such a way as to encircle gate global wiring line GL. Source connections SC are arranged, for example, close to substrate corners in termination region 100E. As shown in FIG. 1B, region 100C where outer periphery source wiring line SL is connected to source pad SP via source connection SC is referred to as "connection region". When n source pads SP are present, n source connections SC may be provided so that each source pad SP is connected to outer periphery source wiring line SL via each source connection SC.

In this example, in a plan view, outer periphery source wiring line SL extends annularly along four sides S1 to S4 of the silicon carbide semiconductor substrate. Four corners ("wiring line corners") of outer periphery source wiring line SL may be each rounded into a circular arc. Out of the four wiring line corners, wiring line corners lying at first and second substrate corners c1, c2 are referred to as "first wiring line corner" and "second wiring line corner", respectively.

Source connections SC include first source connection SC1 connecting first source pad SP1 to outer periphery source wiring line SL, and second source connection SC2 connecting second source pad SP2 to outer periphery source wiring line SL.

First source connection SC1 lies at first substrate corner c1 and is thus disposed between first portion g1 and second portion g2 of gate global wiring line GL. Second source connection SC2 lies at second substrate corner c2 and is thus disposed between first portion g1 and third portion g3 of gate global wiring line GL. According to this configuration, at first substrate corner c1, first source connection SC1 lies between the first wiring line corner of outer periphery source wiring line SL and a corner of active region 100A and is in contact with the first wiring line corner of outer periphery source wiring line SL. In a similar manner, at second substrate corner c2, second source connection SC2 lies between the second wiring line corner of outer periphery source wiring line SL and a corner of active region 100A and is in contact with the second wiring line corner of outer periphery source wiring line SL.

A configuration of each unit cell 100u will then be described with reference to FIG. 2.

The plurality of unit cells 100u each function as a MOSFET, and are connected in parallel to each other. In other words, unit cells 100u serve as transistors. Silicon carbide semiconductor device 201 thus includes a plurality of the transistors. In a view in a direction perpendicular to the main surface of the silicon carbide semiconductor substrate, the plurality of unit cells 100u are arranged two-dimensionally in cell regions 100B.

Each of unit cells 100u includes semiconductor substrate 101, first silicon carbide semiconductor layer 102, first body region 103 of the second conductivity type, first body region 103 being selectively formed on a surface of first silicon carbide semiconductor layer 102, source region 104 selectively formed on a surface of first body region 103, gate insulating film 107 lying above first silicon carbide semiconductor layer 102, gate electrode 108 lying on gate insulating film 107, and drain electrode 110. Second silicon carbide semiconductor layer 106 may be provided as a channel layer between first silicon carbide semiconductor layer 102 and gate insulating film 107.

In the first silicon carbide semiconductor layer 102, source region 104 contains impurities of the first conductivity type ($n^+$-type) at high concentration. For electrical connection to first body region 103, first contact region 105 of the second conductivity type containing impurities of the second conductivity type at concentration higher than that of the impurities in first body region 103 is provided at a location that is between source region 104 and that is in contact with first body region 103 under source region 104. On the surface of first silicon carbide semiconductor layer 102, source electrode 109 is provided, source electrode 109 being electrically connected to source region 104 and first contact region 105 through ohmic contact. First body region 103 is thus electrically connected to source electrode 109 via first contact region 105.

First body region 103, source region 104, and first contact region 105 are formed through, for example, a process of implanting impurities into first silicon carbide semiconductor layer 102 and a high-temperature heat treatment (activation anneal) for activating the impurities implanted into first silicon carbide semiconductor layer 102. Source electrode 109 can be formed, for example, by forming a conductive material layer (Ni layer) on source region 104 and first contact region 105 in first silicon carbide semiconductor layer 102 and then subjecting the conductive material layer to a high-temperature heat treatment.

Source region 104 and first silicon carbide semiconductor layer 102 are connected via second silicon carbide semiconductor layer 106 serving as the channel layer. Second silicon carbide semiconductor layer 106 is a 4H—SiC layer formed on first silicon carbide semiconductor layer 102 through, for example, an epitaxial growth process, and is doped with impurities of the first conductivity type. Second silicon carbide semiconductor layer 106 may have a thickness of, for example, 75 nm or less, and a doping concentration of $1 \times 10^{18}$ cm$^{-3}$ or higher.

Source region 104 and first contact region 105 are each in ohmic contact with source electrode 109. When silicon carbide semiconductor device 201 does not include second silicon carbide semiconductor layer 106, a gate voltage is applied to form an inversion layer at the surface of first body regions 103, the inversion layer serving as a channel. This allows the transistor to operate.

Gate insulating film 107 is, for example, a thermal oxide film (SiO$_2$ film) formed by thermally oxidizing a surface of second silicon carbide semiconductor layer 106.

Gate electrode 108 is made of, for example, conductive polysilicon. Gate electrodes 108 of unit cells 100u adjacent to each other are connected with each other. Conductive layer 118 including gate electrodes 108 of the plurality of unit cells 100u is referred to as "gate electrode layer". In active region 100A, gate electrode layer 118 is disposed on gate insulating film 107 as a mesh structure in which gate electrode layer 118 is not present in locations occupied by source electrodes 109 and base electrodes 119a. As a result, along the 2-2 line cross-section where source electrodes 109 are present, gate electrode layer 118 is split when crossing the locations of source electrodes 109, as shown in FIG. 2. However, in an another cross-section where source electrodes 109 are not present, which is not shown, gate electrode layer 118 is continuous.

Interlayer insulating film 111 lies above first silicon carbide semiconductor layer 102 or second silicon carbide semiconductor layer 106 in such a way as to cover gate electrode layer 118 and the like, in active region 100A and termination region 100E. Interlayer insulating film 111 has openings 111c. Source electrode 109 of each of the unit cells is connected in parallel to source pad SP of the upper source electrode (e.g., Al electrode) through each of these openings 111c. Contact Ps through which source pad SP is electrically connected to source electrode 109 of each unit cell 100u is referred to as "source contact".

Silicon carbide semiconductor device 201 has termination structure 100e in termination region 100E. Silicon carbide semiconductor has a critical breakdown field strength of 10 times or higher than that of Si. It is thus important for the silicon carbide semiconductor device to suppress breakdown caused by electric field crowding on a surface structure of the semiconductor device. Termination structure 100e mitigates electric field crowding on the surface of the semiconductor device. No unit cell 100u operating as a transistor is provided in termination region 100E.

In termination region 100E, termination structure 100e includes semiconductor substrate 101 and first silicon carbide semiconductor layer 102 lying on the main surface of semiconductor substrate 101. Termination structure 100e is selectively formed on the surface of first silicon carbide semiconductor layer 102, and includes second body region 115 of the second conductivity type, second body region 115 encircling active region 100A, and second contact region 116 of the second conductivity type, second contact region 116 being selectively formed on a surface of second body region 115. Above second body region 115 and second contact region 116, interlayer insulating film 111 is formed. Second contact region 116 encircles active region 100A as second body region 115 does. Second body region 115 may have an impurity concentration profile identical to the impurity concentration profile of the first body region 103 in a depth direction. Similarly, second contact region 116 may have an impurity concentration profile identical to the impurity concentration profile of the first contact region 105 in the depth direction. In other words, second body region 115 may be formed by the same process by which first body region 103 is formed, and second contact region 116 may be formed by the same process by which first contact region 105 is formed. First silicon carbide semiconductor layer 102 may have no second contact region 116 and no first contact region 105.

Termination structure 100e includes a plurality of base electrodes (first base electrodes) 119a, and base electrodes (second base electrodes) 119b, 119c. Base electrodes 119a, 119b, 119c are formed on the surface of first silicon carbide semiconductor layer 102 such that base electrodes 119a, 119b, 119c are in contact with second contact region 116. Base electrodes 119a lie in a region included in second contact region 116 in termination region 100E, the region being on an inner periphery side (left-hand side in FIG. 2) close to the active region 100A. On the surface of first silicon carbide semiconductor layer 102, base electrodes 119a are made into island shapes and are arranged in a similar manner in which respective source electrodes 109 of unit cells 100u are arranged. On the other hand, base electrodes 119b, 119c lie in a region that is outside of the peripheries of gate electrodes 108, which will be described later, and is on an outer periphery side (right-hand side in FIG. 2) in second contact region 116, to encircle active region 100A. In other words, base electrodes 119b, 119c have annular shapes in a view in the direction perpendicular to the main surface of semiconductor substrate 101. According to the present exemplary embodiment, termination structure 100e includes two base electrodes 119b, 119c of annular shapes. Base electrode 119c, lying outside of base electrode 119b with respect to the active region 100A, encircles base electrode 119b. A number of the annular base electrodes may be one or three or more. Base electrodes 119a, 119b, 119c can be formed, for example, by forming a conductive material layer (e.g., Ni layer) on second contact region 116 in first silicon carbide semiconductor layer 102 and then subjecting the conductive material layer to a high-temperature heat treatment. Thus, base electrodes 119a, 119b, 119c can be formed using the same material making up source electrode 109.

In termination region 100E, second silicon carbide semiconductor layer 106, which functions as the channel layer, and gate insulating film 107 lie on first silicon carbide semiconductor layer 102. On gate insulating film 107, gate electrode layer 118 is formed to extend from the active region 100A. Portion 108f of gate electrode layer 118, portion 108f being included in termination region 100E, is referred to as "gate frame". Gate frame 108f is disposed in such a way as to encircle the meshed structure part of gate electrode layer 118, that is, the part functioning as gate electrodes 108 of the plurality of unit cells 100u (see FIG. 3 to be referred to later). Gate electrode layer 118 is covered with interlayer insulating film 111. These constituent elements are continuous with the corresponding constituent elements in active region 100A.

Interlayer insulating film 111 has openings 111d, and, in these openings 111d, base electrodes 119a, 119b, 119c are connected to the upper source electrode. In other words, the upper source electrode is electrically connected to second body region 115 via base electrodes 119a to 119c. In this example, outer periphery source wiring line SL of the upper source electrode is connected to annular base electrodes 119b, 119c. Outer periphery source wiring line SL has an annular shape corresponding to the shapes of base electrodes 119b, 119c. Outer periphery source wiring line SL may be split into a portion in contact with base electrode 119b and a portion in contact with base electrode 119c. Source pads SP of the upper source electrode are connected to respective source electrodes 109 and base electrodes 119a of unit cells 100u. In this specification, contact Pob electrically connecting outer periphery source wiring line SL to second body region 115 is referred to as "outer periphery body contact", while contact Pib electrically connecting source pads SP to second body region 115 is referred to as "inner periphery body contact". Outer periphery body contact Pob, for example, may extend annularly.

Similarly, interlayer insulating film 111 has openings 111g, and gate frame 108f of gate electrode layer 118 is connected to gate global wiring line GL of the upper gate electrode through openings 111g. Contact Pg connecting gate electrode layer 118 to the upper gate electrode is referred to as "gate contact". A gate contact connecting gate electrode layer 118 to gate connection wiring line GCL, the gate contact not being depicted, is also provided under gate connection wiring line GCL.

Termination structure 100e has at least one ring region 120 of the second conductivity type, at least one ring region 120 being included in field limiting ring (FLR) region 100F lying on the surface of first silicon carbide semiconductor layer 102 and encircling second body region 115. Ring region 120 of the p-type, in a view in the direction perpendicular to the surface of semiconductor substrate 101, has a ring shape encircling second body region 115 lying outside active region 100A. In the present exemplary embodiment, a plurality of ring regions 120 are provided to make up a field limiting ring (FLR) structure. In the view in the direction perpendicular to the surface of semiconductor substrate 101, each of the rings is a rectangle with four corners rounded into circular arcs. Rounding the four corners into circular arcs prevents electric field crowding at the four corners. For example, each ring region 120 may have an impurity concentration profile identical to the impurity concentration profile of first body region 103 in active region 100A and that of second body region 115 in the depth direction.

Silicon carbide semiconductor device 201 can be manufactured according to the same procedure by which an ordinary semiconductor device is manufactured, using basic technologies for manufacturing semiconductor devices that have been mentioned in the description of each constituent element.

<Effects Achieved by Upper Electrode Structure of Silicon Carbide Semiconductor Device 201>

In silicon carbide semiconductor device 201, source connections SC are arranged on the substrate corners. This offers the following effects.

As described above, on the silicon carbide semiconductor substrate, ring regions 120 of the FLR structure are formed to improve breakdown characteristics. However, at each of the substrate corners (substrate corners c1 to c4 shown in FIG. 1A and the like), the breakdown voltage is lower than that at the (straight) portion between two adjacent substrate corners. For this reason, when a drain voltage reaches an avalanche voltage and avalanche breakdown occurs as a consequence, a large current (avalanche current) could be generated at a substrate corner since it has a lower breakdown voltage. A flow of this large current through outer periphery source wiring line SL with a small wiring line width may possibly lead to deterioration of outer periphery source wiring line SL, such as wire-breaking. To suppress the deterioration of outer periphery source wiring line SL, it is preferred to let the avalanche current escape directly to source pads SP without flowing through outer periphery source wiring line SL as much as possible. According to the present exemplary embodiment, because source connections SC are arranged at the substrate corners, it is possible to let the avalanche current directly flow into source pads SP through source connections SC without allowing the avalanche current to flow through outer periphery source wiring line SL. Deterioration of the wiring line caused by the avalanche current, therefore, can be suppressed.

Source connections SC may be arranged at substrate corners located distant from gate pad GP among the four substrate corners of the silicon carbide semiconductor substrate. Advantages in this configuration will hereinafter be described.

In silicon carbide semiconductor device 201, the silicon carbide semiconductor substrate is a rectangle, on which, among the four substrate corners, substrate corners c3, c4 lying on both sides of the side on which gate pad GP is disposed are defined as "substrate corners close to gate pad GP" and substrate corners c1, c2 lying on both sides of the side opposite to the side on which gate pad GP is disposed are defined as "substrate corners distant from gate pad GP". When gate global wiring line GL is split at substrate corners c3, c4 close to gate pad GP and source connections SC are arranged at substrate corners c3, c4, a length of a portion of gate global wiring line GL extending from gate pad GP to substrate corner c3 along side S4 and a length of a portion of gate global wiring line GL extending from gate pad GP to substrate corner c4 along side S4 are each given as a×(½), where "a" denotes a length of one side of silicon carbide semiconductor substrate. In this case, a total length of a wiring line including gate connection wiring line GCL and rest of gate global wiring line GL extending along sides S1 to S3 is given as a×5. It should be noted that in this case, the length of gate connection wiring line GCL is considered to be equivalent to twice the length of a single side (a×2) since gate connection wiring line GCL supplies current to cell regions on both side of gate connection wiring line GCL. In this manner, when respective lengths of the wiring lines are dramatically different from each other, gate current concentrates on a wiring line with a larger length. This could deteriorate the reliability of the wiring line. In contrast, when gate global wiring line GL is split at substrate corners c1, c2 distant from gate pad GP and source connections SC are arranged at substrate corners c1, c2, a length of a portion of gate global wiring line GL extending from gate pad GP to substrate corner c1 and a length of a portion of gate global wiring line GL extending from gate pad GP to substrate corner c2 are each given as a×(3/2). A total length of a wiring line including gate connection wiring line GCL and rest of gate global wiring line GL extending along side S1 is thus given as a×3. In this case, therefore, the difference between a maximum wiring line length and a minimum wiring line length is made smaller as compared to the case where source connections SC are arranged at substrate corners c3, c4. Variation of gate currents flowing through different wiring lines is thus reduced.

When source connections SC are arranged at substrate corners c1, c2, arranging source connections SC at substrate corners c3, c4 is unnecessary. When source connections SC are arranged at substrate corners c1, c2, the potential at substrate corners c1, c2 during avalanche breakdown is closer to the potential at source pads SP than at substrate corners c3, c4 due to a voltage drop along outer periphery source wiring line SL. As a result, the drain-to-source voltage at substrate corners c3, c4 becomes smaller than at substrate corners c1, c2. This means that avalanche breakdown is likely to occur at substrate corners c1, c2 where source connections SC are present but it is less likely to occur at substrate corners c3, c4 distant from source connections SC. By arranging source connections SC at substrate corners c1, c2, therefore, avalanche breakdown can be suppressed at substrate corners c3, c4 even if source connections SC are not arranged at substrate corners c3, c4.

In silicon carbide semiconductor device 201, gate global wiring line GL extends in such a way as to encircle the plurality of source pads SP. This suppresses creation of a region where resistance (hereinafter "gate resistance") locally increases in gate electrode layer 118, thus eliminating current concentration on a chip surface that occurs at high-speed switching and improving reliability of the device. Gate global wiring line GL is applicable if it encircles the plurality of source pads SP, and may be split at one or a plurality of spots, as mentioned above.

Each source pad SP in silicon carbide semiconductor device 201 may be encircled with the upper gate electrode (gate pad GP, gate global wiring line GL, and gate connection wiring line GCL). This suppresses a local increase in gate resistance more effectively. In silicon carbide semiconductor device 201, cell region 100B is split into two regions via gate connection wiring line GCL, and source pads SP are provided in the two regions, respectively. The upper gate electrode is disposed in such a way as to encircle each source pad SP. When source pads are provided as the plurality of split source pads, it reduces the area of a region encircled with the upper gate electrode, thus reducing in-plane variance of gate resistance more effectively.

Figure 10:
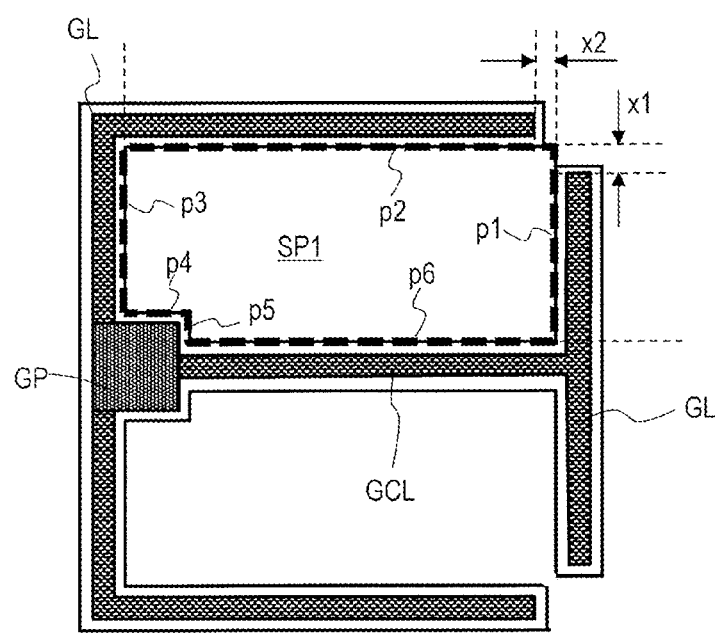
FIG. 10 is a plan view for schematically describing a placement relation between source pad SP and an upper gate electrode.

"The upper gate electrode is disposed in such a way as to encircle source pad SP" means that, for example, 95% or more of an outer periphery of source pad SP is adjacent to the upper gate electrode. This configuration will be described by taking first source pad SP1 of silicon carbide semiconductor device 201 as an example, with reference to FIG. 10. In a plan view, first source pad SP1 has a polygonal outer periphery made up of six sides p1 to p6. The outer periphery used herein is a virtual outer periphery made up of straight segments defined as sides of first source pad SP, as indicated by the dashed line in FIG. 10. Looking at side p1 on the right-hand side in FIG. 10 reveals that most of side p1 is adjacent to gate global wiring line GL but a portion of side p1 that is close to the upper right corner, the portion having a length x1, is not adjacent to any part of the upper gate electrode. "A side is adjacent to the upper gate electrode" means that the upper gate electrode is disposed adjacent to the side in a direction perpendicular to the side. Similar to the this case, most of side p2 is adjacent to gate global wiring line GL but a portion of side p2 that is close to the upper right corner, the portion having a length x2, is not adjacent to any part of the upper gate electrode. Each of other sides p3 to p6 is entirely adjacent to the upper gate electrode. Specifically, side p3 is adjacent to gate global wiring line GL, sides p4, p5 are adjacent to gate pad GP, and side p6 is adjacent to gate connection wiring line GCL. In this case, when a total length of the virtual outer periphery (sides p1 to p6) of first source pad SP is defined as outer periphery length Y, ratio R of a total length of portions of sides p1 to p6 that are adjacent to the upper gate electrode, the total length being Y−x1−x2, to outer periphery length Y is calculated to be, for example, 95% or more and less than 100%. Ratio R should preferably be equal to or more than 98%.

The effect achieved by this configuration will hereinafter be described in detail, referring to simulation results.

Figure 8:
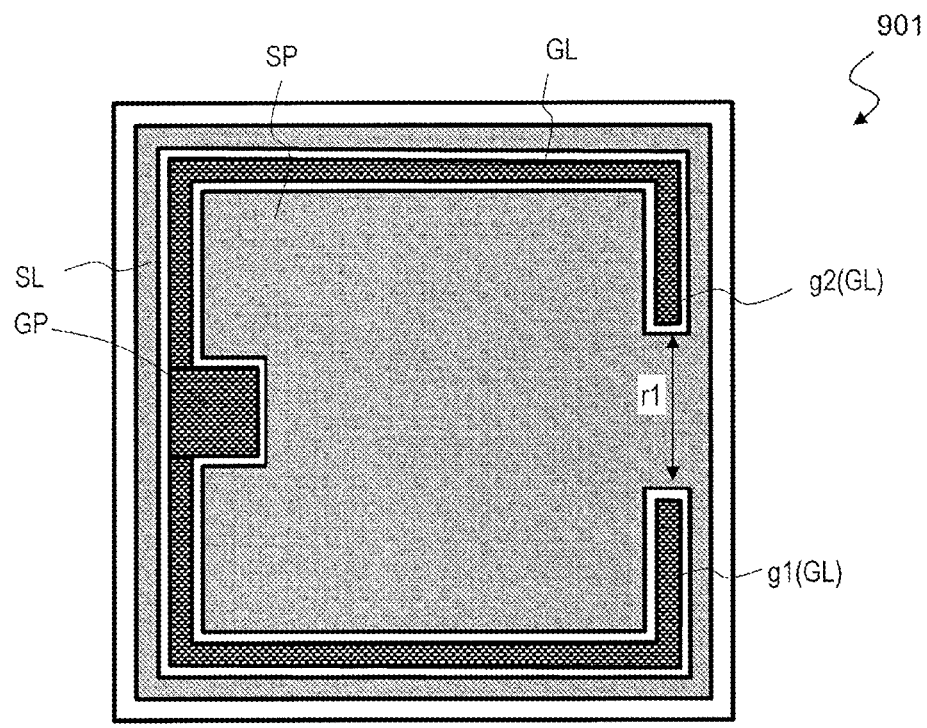
FIG. 8 is a plan view of silicon carbide semiconductor device 901 presented as a comparative example.

FIG. 8 is a plan view of silicon carbide semiconductor device 901 presented as a comparative example. A structure of silicon carbide semiconductor device 901 is disclosed, for example, in PTL 1. In FIG. 8, the same constituent elements as described in FIG. 1A are denoted by the same reference numerals.

In silicon carbide semiconductor device 901, one source pad SP is disposed in active region 100A. Outside source pad SP, gate global wiring line GL is disposed. Outside gate global wiring line GL, outer periphery source wiring line SL is disposed. Gate global wiring line GL does not completely encircle source pad SP, and has a wide opening formed at the center of a side opposite to gate pad GP. In this example, ratio R of a total length of a portion of source pad SP that is adjacent to the upper gate wiring line (gate global wiring line GL), the total length being given by deducting a length of opening r1 from outer periphery length Y, to outer periphery length Y of source pad SP is calculated to be, for example, about 90%. Through opening r1 of gate global wiring line GL, source pad SP is connected to outer periphery source wiring line SL. Silicon carbide semiconductor device 901 is different from silicon carbide semiconductor device 201 of FIG. 1A in the shape of the upper gate electrode but is the same as silicon carbide semiconductor device 201 in other structural elements, such as the shape of the gate electrode layer.

Figure 9A:
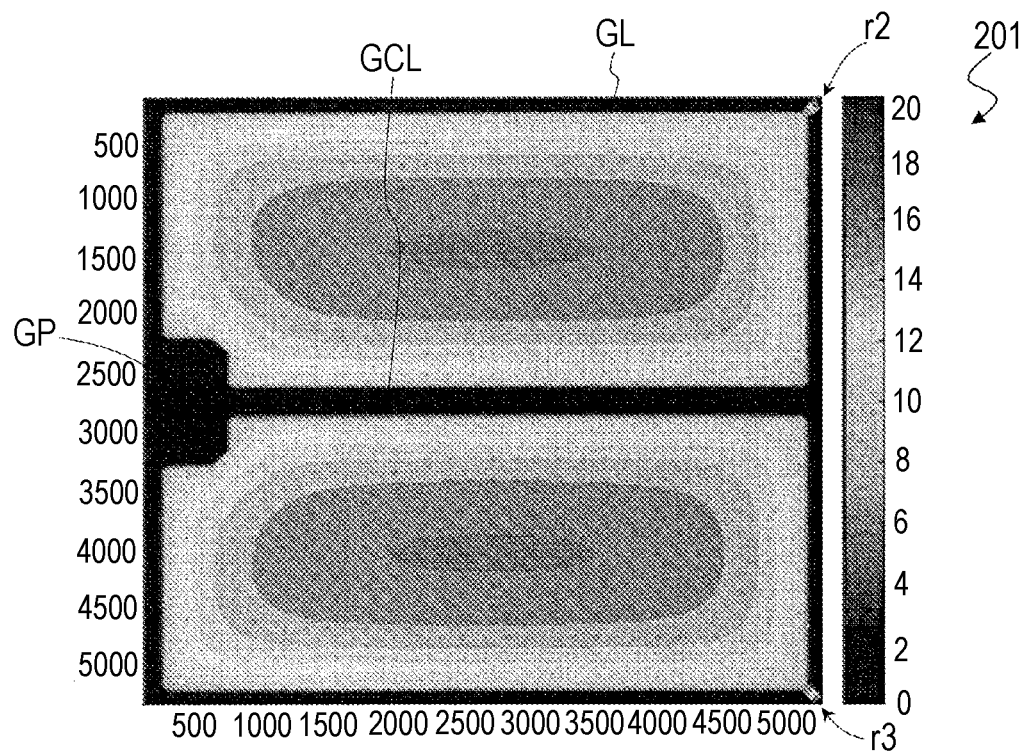
FIG. 9A depicts a gate resistance distribution in a substrate surface in silicon carbide semiconductor device 201.
Figure 9B:
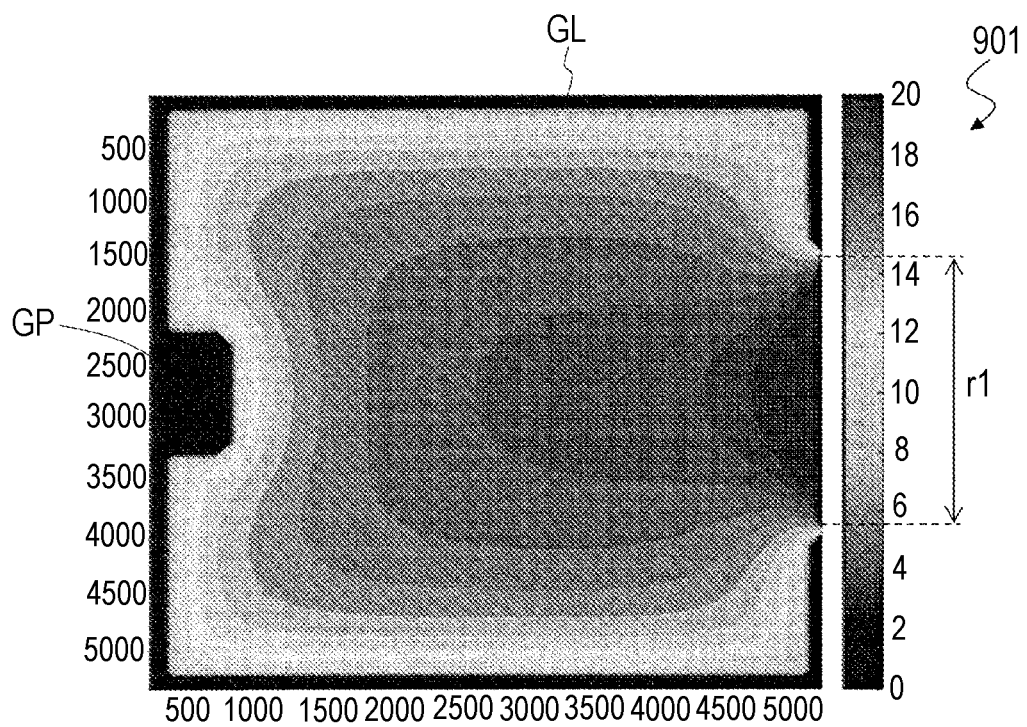
FIG. 9B depicts a gate resistance distribution in a substrate surface in silicon carbide semiconductor device 901 presented as the comparative example.

FIGS. 9A and 9B are plan views showing gate resistance distributions of silicon carbide semiconductor device 201 of FIG. 1A and silicon carbide semiconductor device 901 of FIG. 8, respectively. With d representing a width two times the width of outer periphery source wiring line SL, a simulation of the gate resistance distributions of silicon carbide semiconductor device 201 and silicon carbide semiconductor device 901 was conducted.

It is understood from FIGS. 9A and 9B that in the comparative example, gate resistance increases locally in a region close to the center of opening r1 of gate global wiring line GL. In the region where gate resistance increases locally, current concentration tends to occur when silicon carbide semiconductor device 901 undergoes high-speed switching.

In silicon carbide semiconductor device 201, on the other hand, gate global wiring line GL has openings r2, r3 at first and second substrate corners c1, c2, respectively, but encircles active region 100A. In addition, each source pad SP is encircled with the upper gate electrode. In this example, ratio R of a total length of a portion of source pad SP that is adjacent to the upper gate wiring line, to outer periphery length Y of source pad SP is calculated to be, for example, 95% or more. As a result, in active region 100A, creation of a region where gate resistance increases locally is suppressed.

According to the present exemplary embodiment, width d of each of openings r2, r3 of gate global wiring line GL and a number of openings r2, r3 are not limited to a specific width and number. In this specification, in a plan view, width d of each of openings r2, r3 is equivalent to the shortest distance between first portion g1 and second portion g2 or between first portion g1 and third portion g3 of gate global wiring line GL. Width d is, for example, equal to or larger than the width of outer periphery source wiring line SL. This ensures a sufficient width of source connection SC, thus suppressing an increase in resistance of source connection SC. Width d may be, for example, equal to or smaller than four times the width of outer periphery source wiring line SL. In such a case, an increase in gate resistance is suppressed effectively in regions close to openings r2, r3 arranged at the substrate corners while displacement current generated during high-speed switching at four sides (S1 to S4) at maximum is allowed to flow through.

<Structure of Substrate Corner>

A structure of the substrate corner at which gate global wiring line GL is split in silicon carbide semiconductor device 201 will then be described more specifically. In the following, first substrate corner c1 will be described as an example. It should be noted, however, that second substrate corner c2 has the same structure as that of first substrate corner c1.

Figure 3:
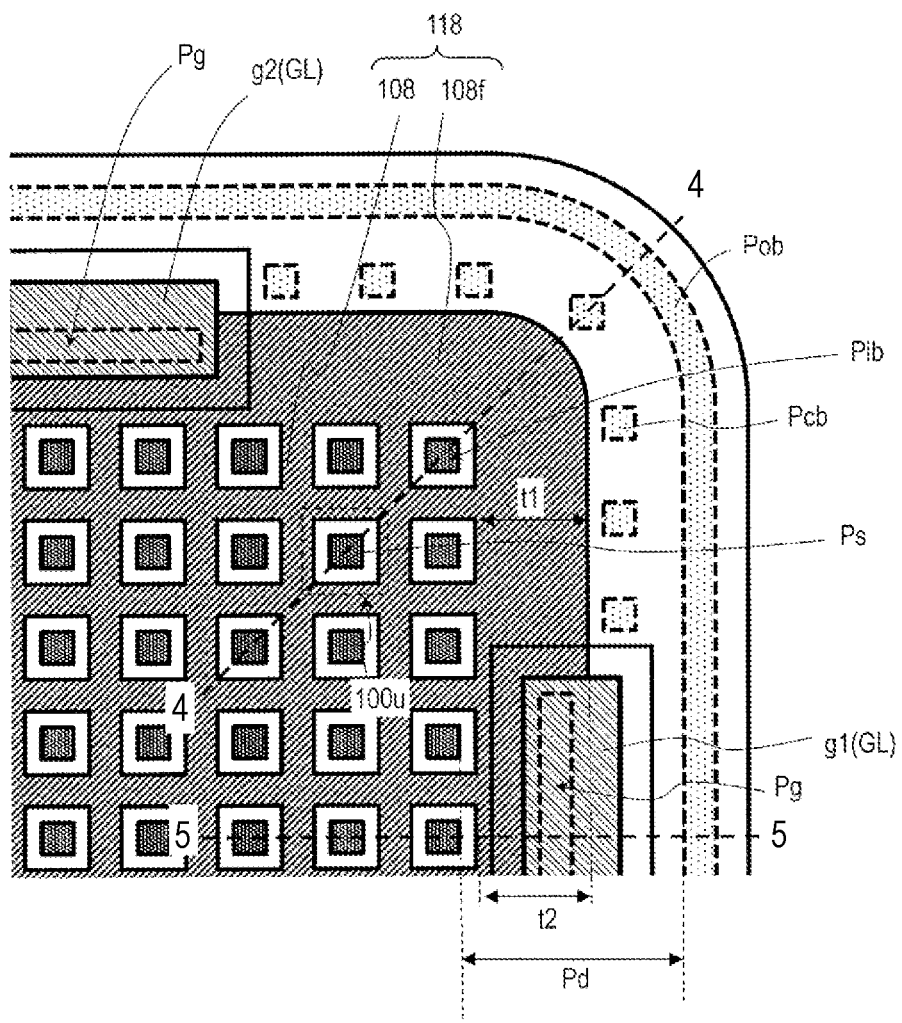
FIG. 3 is an enlarged plan view of a substrate corner of silicon carbide semiconductor device 201.
Figure 4:
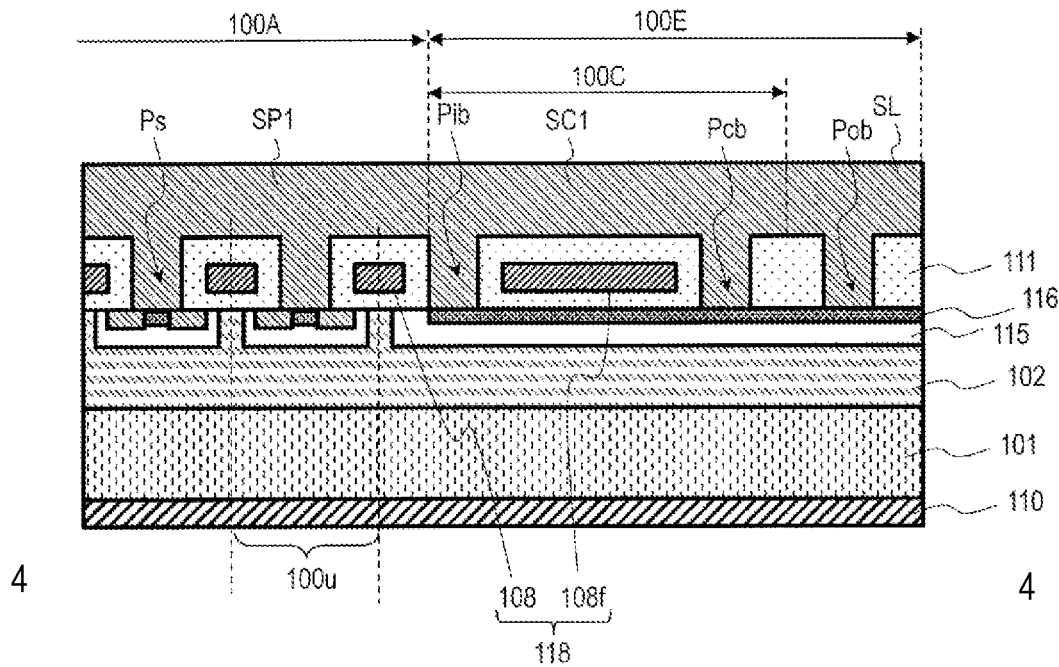
FIG. 4 is a sectional view of silicon carbide semiconductor device 201, the sectional view being taken along line 4-4 in FIG. 3.
Figure 5:
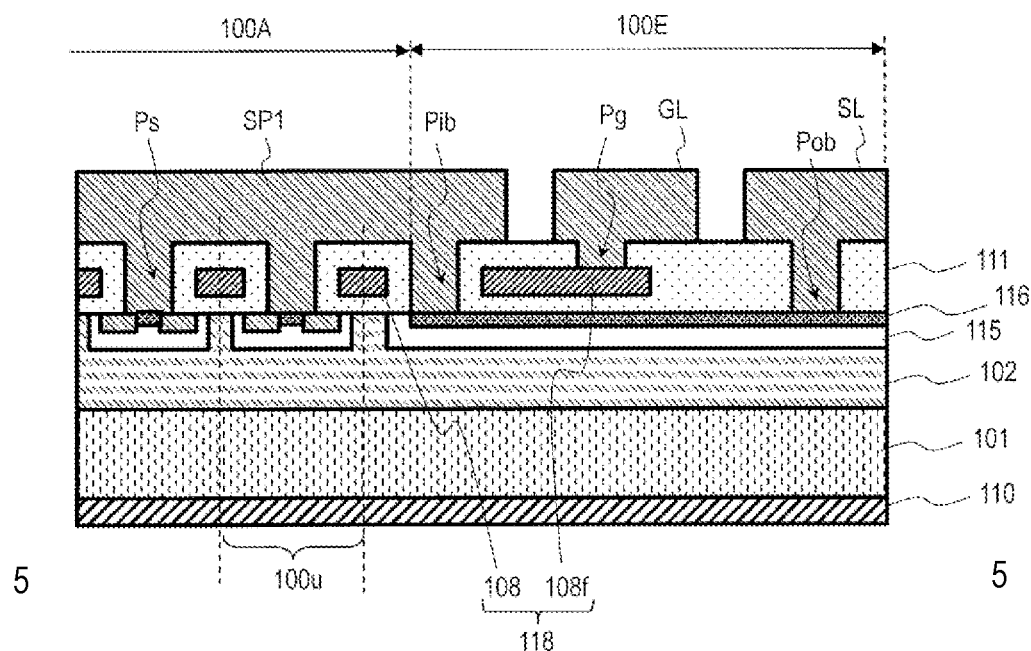
FIG. 5 is a sectional view of silicon carbide semiconductor device 201, the sectional view being taken along line 5-5 in FIG. 3.

FIG. 3 is an enlarged plan view of first substrate corner c1 of silicon carbide semiconductor device 201. FIGS. 4 and 5 are schematic cross-sectional views taken along line 4-4 and line 5-5 in FIG. 3, respectively. In FIGS. 4 and 5, the same constituent elements as depicted in FIGS. 1A and 2 are denoted by the same reference numerals. From the cross-sectional views of FIGS. 4 and 5, some constituent elements shown in FIG. 2 are omitted.

At first substrate corner c1, gate global wiring line GL is split into first portion g1 and second portion g2. First portion g1 and second portion g2 are each electrically connected to gate frame 108f of gate electrode layer 118, gate frame 108f lying outside active region 100A, through gate contact Pg.

A periphery of gate electrode layer 118 is separated from a periphery of active region 100A by gaps t1, t2. These gaps t1, t2 are equivalent to the width of gate frame 108f. Width t1 of a part of gate frame 108f that lies under source connection SC may be the same as width t2 of a part of gate frame 108f that lies under gate global wiring line GL.

Conventionally, in order to control a potential at a part of gate electrode layer 118 that lies outside active region 100A, gate electrode layer 118 is extended under gate global wiring line GL only. In other words, in a plan view, the periphery of gate electrode layer 118 has a recession formed in an opening of gate global wiring line GL. However, in such a conventional configuration, the gate resistance of a unit cell close to the opening of gate global wiring line GL, that is, a unit cell close to the corner of active region 100A tends to increase locally. In contrast, according to the present exemplary embodiment, gate electrode layer 118 is extended also in the opening of gate global wiring line GL, that is, under source connection SC, by given distance t1 in a region outside active region 100A. This configuration suppresses a local increase in the gate resistance of the unit cell close to the corner of active region 100A. Hence a safety operation area of silicon carbide semiconductor device 201 is further expanded.

Width t1 of the part of gate frame 108f that lies under source connection SC may not be the same as width t2 of the part of gate frame 108f that lies under gate global wiring line GL. Width t1 may be equal to or smaller than the shortest distance Pd between outer periphery body contact Pob and inner periphery body contact Pib. This configuration suppresses destruction of gate insulating film 107 caused by displacement current under gate frame 108f extended from active region 100A. Further, width t1 may be equal to or larger than, for example, the width of unit cell 100u. Width t1 may be equal to or larger than, for example, two times the width of unit cell 100u. This configuration further reduces the gate resistance of the unit cell close to the corner of active region 100A and allows effective utilization of characteristic behavior of displacement current flowing under gate frame 108f that displacement current branches into two subcurrents that flow through, respectively, outer periphery body contact Pob and corner body contact Pcb, which will be described later.

At first substrate corner c1, a plurality of body contacts (hereinafter "corner body contacts") Pcb may be arranged outside gate electrode layer 118, body contacts Pcb connecting source connection SC (first source connection SC1) to second body region 115. When width t1 of gate frame 108f is increased under source connection SC, electric charges generated in second body region 115 flow into inner periphery body contact Pib as a displacement current when switching operations are performed. As a result, a potential at second body region 115 rises in proportion to the displacement current, sheet resistance of second body region 115, and contact resistance of inner periphery body contact Pib. This raises the possibility that destruction of gate insulating film 107 may occur under gate frame 108f. Providing corner body contacts Pcb outside gate frame 108f, however, allows electric charges to escape to the source through corner body contacts Pcb as well as inner periphery body contact Pib. This allows a reduction in the above displacement current, thus ensuring high reliability of the device.

Corner body contacts Pcb are arranged between outer periphery body contact Pob, which connect outer periphery source wiring line SL to second body region 115, and gate electrode layer 118. Corner body contacts Pcb are arranged along the outer periphery of gate frame 108f such that corner body contacts Pcb may be arranged at intervals or may be connected to each other to make up a single form of corner body contact Pcb. In this example, corner body contacts Pcb are lined up into a single row. Corner body contacts Pcb, however, may be arranged into a plurality of rows.

MODIFICATIONS

Figure 6:
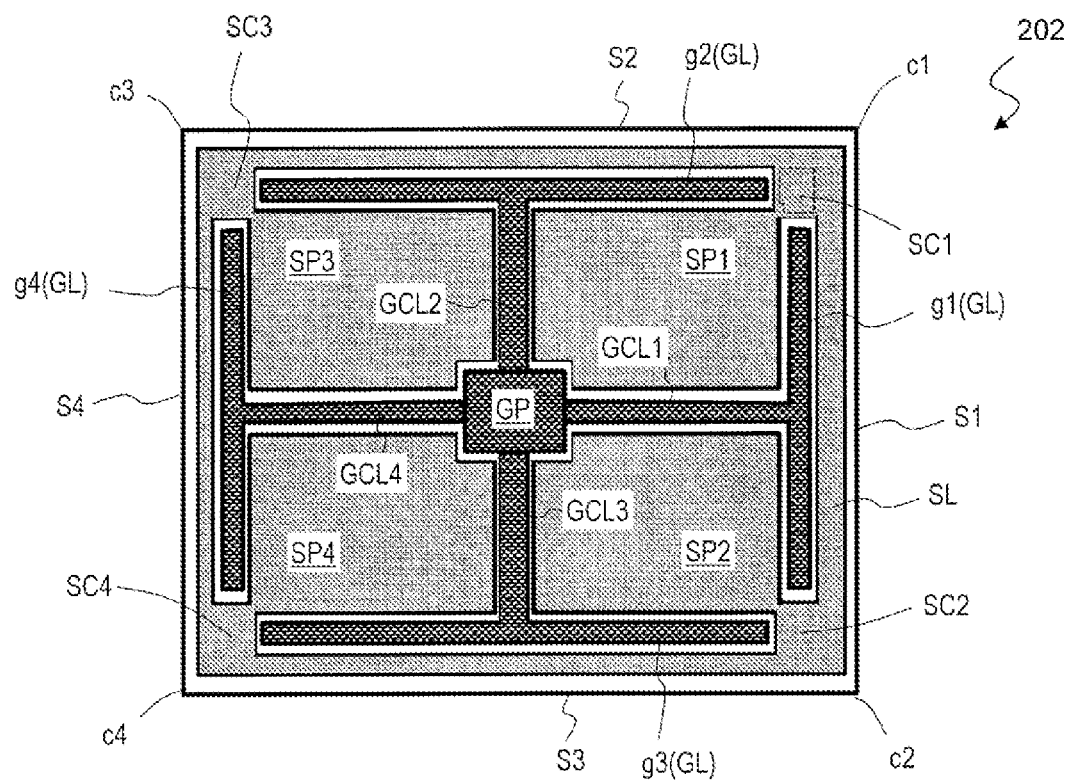
FIG. 6 is a plan view of silicon carbide semiconductor device 202 according to another exemplary embodiment.
Figure 7:
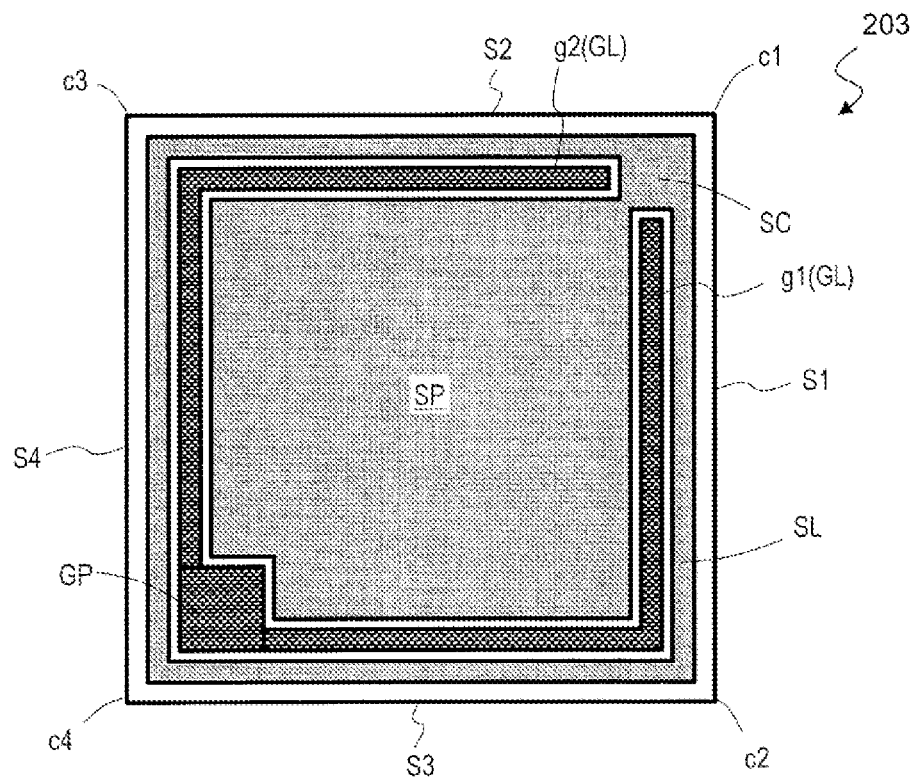
FIG. 7 is a plan view of silicon carbide semiconductor device 203 according to still another exemplary embodiment.

FIGS. 6 and 7 are plan views showing silicon carbide semiconductor devices 202, 203 as modifications of the silicon carbide semiconductor device according to the present exemplary embodiment. In the following, differences between these modifications and silicon carbide semiconductor device 201 shown in FIG. 1A will be described.

In silicon carbide semiconductor device 202 shown in FIG. 6, gate pad GP is disposed at the center of active region 100A. Around gate pad GP, four source pads SP1 to SP4 are arranged.

Gate global wiring line GL is disposed in the termination region in such a way as to encircle source pads SP1 to SP4. Gate global wiring line GL is split at each of first substrate corner c1 to fourth substrate corner c4, thus having four portions g1 to g4 extending along sides S1 to S4, respectively.

Between gate pad GP and portions g1 to g4 of gate global wiring line GL, gate connection wiring lines GCL1 to GCL4 are arranged, respectively. Gate connection wiring line GCL1 extends from gate pad GP and stretches out between source pads adjacent to each other toward side S1 to connect to portion g1 of gate global wiring line GL. Similarly, gate connection wiring lines GCL2 to GCL4 extend from gate pad GP and stretch out between respective pairs of source pads adjacent to each other toward sides S2 to S4 to connect to portions g2 to g4 of gate global wiring line GL, respectively.

Outer periphery source wiring line SL extends in termination region 100E in such a way as to encircle gate global wiring line GL. Source pads SP1 to SP4 are connected to outer periphery source wiring line SL via source connections SC1 to SC4, respectively. Each of source connections SC1 to SC4 lies between two split portions of gate global wiring line GL at each of substrate corners c1 to c4.

According to silicon carbide semiconductor device 202, each of four regions into which the cell region is split can be encircled with gate global wiring line GL and gate connection wiring line GCL. An area encircled with the gate wiring line is thus further reduced. As a result, variance in gate resistance is further reduced effectively.

In silicon carbide semiconductor device 203 shown in FIG. 7, gate pad GP is disposed at one substrate corner c4 of the silicon carbide semiconductor substrate. Source pad SP is not split by the gate wiring line and is therefore provided as a single source pad.

Gate global wiring line GL extends in the termination region in such a way as to encircle source pad SP. Gate global wiring line GL is split at substrate corner c1 into first portion g1 and second portion g2, substrate corner c1 being located farthest from gate pad GP among the four substrate corners. In this example, no gate connection wiring line GCL is provided.

Outer periphery source wiring line SL is disposed in such a way as to encircle gate global wiring line GL. Outer periphery source wiring line SL is connected to source pad SP via source connection SC. At substrate corner c1, source connection SC lies between first portion g1 and second portion g2 of gate global wiring line GL.

Other structural elements and a detailed structure of substrate corners including source connections SC according to silicon carbide semiconductor devices 202, 203 may be the same as those according to silicon carbide semiconductor device 201 described above.

The silicon carbide semiconductor device according to the present exemplary embodiment is not limited to the above planar-structured vertical MISFET but may be a trench-structured vertical MISFET. The silicon carbide semiconductor device may also be provided as an insulated gate bipolar transistor (IGBT) including a silicon carbide substrate of a conductivity type different from the conductivity type of the silicon carbide semiconductor layer.

The silicon carbide semiconductor device according to the present disclosure is widely applicable to semiconductor devices for various uses and to various drivers, such as inverter circuits equipped with the semiconductor devices. For example, the silicon carbide semiconductor device is applied preferably to semiconductor devices for use in in-vehicle components, industrial equipment, or the like.

What is claimed is:

1. A silicon carbide semiconductor device comprising:
   a silicon carbide semiconductor substrate including an active region and a termination region encircling the active region;
   a plurality of unit cells lying in the active region, each of the unit cells having a transistor structure; and
   a termination structure lying in the termination region, wherein
   the silicon carbide semiconductor device further comprises:
   an upper gate electrode including a gate pad and a gate wiring line extending from the gate pad, the upper gate electrode being electrically connected to respective gate electrodes of the plurality of unit cells; and
   an upper source electrode including a plurality of source pads including a first source pad and a second source pad that are arranged in the active region, the upper source electrode being electrically connected to source electrodes of the plurality of unit cells, wherein
   the gate wiring line includes a gate global wiring line extending in the termination region to encircle the plurality of source pads, and a gate connection wiring line extending from the gate pad to stretch between the first source pad and the second source pad in the active region, wherein
   the upper source electrode further includes an outer periphery source wiring line extending in the termination region to encircle the gate global wiring line, a first source connection connecting the outer periphery source wiring line to the first source pad, and a second source connection connecting the outer periphery source wiring line to the second source pad, wherein
   the silicon carbide semiconductor substrate, in a plan view, has a plurality of substrate corners including a first substrate corner and a second substrate corner, and the gate global wiring line is split at the first substrate corner and at the second substrate corner, wherein
   the gate global wiring line includes a first portion lying between the first substrate corner and the second substrate corner, a second portion split from the first portion at the first substrate corner, and a third portion split from the first portion at the second substrate corner, the first portion being in contact with the gate connection wiring line, and wherein
   the first source connection is disposed between the first portion and the second portion at the first substrate corner, and the second source connection is disposed between the first portion and the third portion at the second substrate corner.

2. The silicon carbide semiconductor device according to claim 1, wherein
   the outer periphery source wiring line has a first wiring line corner and a second wiring line corner lying respectively at the first substrate corner and the second substrate corner, wherein
   the first source connection is in contact with the first wiring line corner of the outer periphery source wiring line, and wherein
   the second source connection is in contact with the second wiring line corner of the outer periphery source wiring line.

3. The silicon carbide semiconductor device according to claim 1, wherein
   in a plan view, a shortest distance between the first portion and the second portion and a shortest distance between the first portion and the third portion are each equal to or larger than a width of the outer periphery source wiring line and are each equal to or smaller than 4 times the width of the outer periphery source wiring line.

4. The silicon carbide semiconductor device according to claim 1, wherein
   the silicon carbide semiconductor substrate is a rectangle, and wherein
   the gate pad lies at a center of a side of the silicon carbide semiconductor substrate, the side being opposite to the first substrate corner and the second substrate corner.

5. The silicon carbide semiconductor device according to claim 1, wherein
   the silicon carbide semiconductor substrate is a rectangle having the first substrate corner, the second substrate corner, a third substrate corner, and a fourth substrate corner, wherein
   the gate pad lies at a center of the silicon carbide semiconductor substrate, wherein
   the plurality of source pads further include a third source pad and a fourth source pad, wherein
   the gate global wiring line is split at each of the first substrate corner to the fourth substrate corner, and wherein
   the silicon carbide semiconductor device further comprises:
   a third source connection lying at the third substrate corner, the third source connection connecting the outer periphery source wiring line to the third source pad; and a fourth source connection lying at the fourth substrate corner, the fourth source connection connecting the outer periphery source wiring line to the fourth source pad.

6. The silicon carbide semiconductor device according to claim 1, wherein
the silicon carbide semiconductor substrate has a semiconductor substrate of a first conductivity type, and a silicon carbide semiconductor layer of the first conductivity type, the silicon carbide semiconductor layer being disposed on a main surface of the semiconductor substrate, wherein
each of the plurality of unit cells in the active region has:
a first body region of a second conductivity type, the first body region being selectively formed on a surface of the silicon carbide semiconductor layer;
a source region of the first conductivity type, the source region being selectively formed in the first body region;
a gate insulating film lying above the silicon carbide semiconductor layer;
the gate electrode lying on the gate insulating film; and
the source electrode electrically connected to the first body region and to the source region, and wherein
the termination structure has:
a second body region of the second conductivity type, the second body region being formed selectively on the surface of the silicon carbide semiconductor layer and having an annular shape encircling the active region; and
at least one ring region of the second conductivity type, the at least one ring region lying on the surface of the silicon carbide semiconductor layer and encircling the second body region.

7. The silicon carbide semiconductor device according to claim 6, further comprising:
a gate electrode layer including the gate electrodes of the plurality of unit cells and a gate frame encircling the gate electrodes of the plurality of unit cells; and
a gate contact electrically connecting the gate global wiring line to the gate frame, wherein
a width of the gate frame under the gate global wiring line is equal to a width of the gate frame under the first source connection and the second source connection.

8. The silicon carbide semiconductor device according to claim 7, further comprising:
a plurality of first corner body contacts connecting the first source connection to the second body region at the first substrate corner; and
a plurality of second corner body contacts connecting the second source connection to the second body region at the second substrate corner.

9. The silicon carbide semiconductor device according to claim 8, further comprising an outer periphery body contact connecting the outer periphery source wiring line to the second body region, wherein
the plurality of first corner body contacts and the plurality of second corner body contacts are arranged between the gate electrode layer and the outer periphery body contact.

10. The silicon carbide semiconductor device according to claim 8, wherein
the plurality of first corner body contacts and the plurality of second corner body contacts are arranged outside the gate frame along an outer periphery of the gate frame.

11. A silicon carbide semiconductor device comprising:
a silicon carbide semiconductor substrate including an active region and a termination region encircling the active region;
a plurality of unit cells lying in the active region, each of the unit cells having a transistor structure; and
a termination structure lying in the termination region, wherein
the silicon carbide semiconductor device further comprises:
an upper gate electrode electrically connected to gate electrodes of the plurality of unit cells, the upper gate electrode including a gate pad and a gate wiring line extending from the gate pad; and
an upper source electrode electrically connected to source electrodes of the plurality of unit cells, the upper source electrode including at least one source pad arranged in the active region, wherein
the gate wiring line includes a gate global wiring line extending in the termination region to encircle the at least one source pad, wherein
the upper source electrode further includes an outer periphery source wiring line extending in the termination region to encircle the gate global wiring line, and a source connection connecting the outer periphery source wiring line to the at least one source pad, wherein
in a plan view, the silicon carbide semiconductor substrate has a plurality of substrate corners, wherein
the gate global wiring line is split into a first portion and a second portion at least at a first substrate corner located farthest from the gate pad among the plurality of substrate corners, and wherein
the source connection is disposed between the first portion and the second portion at the first substrate corner.

12. The silicon carbide semiconductor device according to claim 11, wherein
the silicon carbide semiconductor substrate has a semiconductor substrate of a first conductivity type, and a silicon carbide semiconductor layer of the first conductivity type, the silicon carbide semiconductor layer being disposed on a main surface of the semiconductor substrate, wherein
each of the plurality of unit cells in the active region has:
a first body region of a second conductivity type, the first body region being selectively formed on a surface of the silicon carbide semiconductor layer;
a source region of the first conductivity type, the source region being selectively formed in the first body region;
a gate insulating film lying above the silicon carbide semiconductor layer;
the gate electrode lying on the gate insulating film; and
the source electrode electrically connected to the first body region and to the source region, and wherein
the termination structure has:
a second body region of the second conductivity type, the second body region being formed selectively on the surface of the silicon carbide semiconductor layer and having an annular shape encircling the active region; and
at least one ring region of the second conductivity type, the at least one ring region lying on the surface of the silicon carbide semiconductor layer and encircling the second body region.

13. The silicon carbide semiconductor device according to claim 12, further comprising:

a gate electrode layer including the gate electrodes of the plurality of unit cells and a gate frame encircling the gate electrodes of the plurality of unit cells; and a gate contact electrically connecting the gate global wiring line to the gate frame, wherein a width of the gate frame under the gate global wiring line is equal to a width of the gate frame under the source connection.

14. The silicon carbide semiconductor device according to claim 13, further comprising a plurality of corner body contacts connecting the source connection to the second body region at the first substrate corner.

15. The silicon carbide semiconductor device according to claim 14, further comprising an outer periphery body contact connecting the outer periphery source wiring line to the second body region, wherein the plurality of corner body contacts are arranged between the gate electrode layer and the outer periphery body contact.

16. The silicon carbide semiconductor device according to claim 14, wherein the plurality of corner body contacts are arranged outside the gate frame along an outer periphery of the gate frame.

* * * * *